United States Patent
Morita et al.

(10) Patent No.: US 7,282,270 B2
(45) Date of Patent: Oct. 16, 2007

(54) CURABLE ORGANOPOLYSILOXANE COMPOSITION AND A SEMICONDUCTOR DEVICE MADE WITH THE USE OF THIS COMPOSITION

(75) Inventors: Yoshitsugu Morita, Chiba Prefecture (JP); Tomoko Kato, Chiba Prefecture (JP); Atsushi Togashi, Midland, MI (US); Hiroji Enami, Chiba Prefecture (JP)

(73) Assignee: Dow Corning Toray Silicone Company, Ltd., Chiyoda (JP)

( * ) Notice: Subject to any disclaimer, the term of this patent is extended or adjusted under 35 U.S.C. 154(b) by 170 days.

(21) Appl. No.: 10/530,693

(22) PCT Filed: Sep. 8, 2003

(86) PCT No.: PCT/JP03/11456
§ 371 (c)(1),
(2), (4) Date: Apr. 8, 2005

(87) PCT Pub. No.: WO2004/037927
PCT Pub. Date: May 6, 2004

(65) Prior Publication Data
US 2006/0073347 A1  Apr. 6, 2006

(30) Foreign Application Priority Data
Oct. 28, 2002  (JP) ............................. 2002-312172

(51) Int. Cl.
*B32B 9/04* (2006.01)

(52) U.S. Cl. ................... 428/447; 525/477; 525/478; 528/15; 528/31; 528/32; 528/43

(58) Field of Classification Search .................. None
See application file for complete search history.

(56) References Cited

U.S. PATENT DOCUMENTS 6,001,943 A  12/1999 Enami et al.
6,225,433 B1 *  5/2001 Isshiki et al. ................. 528/15

FOREIGN PATENT DOCUMENTS

WO  WO 01/17570 A1  3/2001

* cited by examiner

Primary Examiner—Marc S. Zimmer
(74) Attorney, Agent, or Firm—Howard & Howard Attorneys, P.C.

(57) ABSTRACT

A curable organopolysiloxane composition includes: (A) a straight-chain organopolysiloxane having per molecule at least two silicon-bonded alkenyl groups and at least one silicon-bonded aryl group; (B) a branched-chain organopolysiloxane with siloxane units represented by the following general formula: $RSiO_{3/2}$, where R is a substituted or unsubstituted monovalent hydrocarbon group, and having per molecule at least one silicon-bonded alkenyl group and at least one silicon-bonded aryl group; (C) an organopolysiloxane having in one molecule at least two silicon-bonded hydrogen atoms; and (D) a hydrosilylation catalyst; and a semiconductor device with a semiconductor element coated with a cured body of the aforementioned composition.

21 Claims, 1 Drawing Sheet

CURABLE ORGANOPOLYSILOXANE COMPOSITION AND A SEMICONDUCTOR DEVICE MADE WITH THE USE OF THIS COMPOSITION

TECHNICAL FIELD

This invention relates to a curable organopolysiloxane composition and a semiconductor device using this composition. More specifically, the invention relates to a curable organopolysiloxane composition suitable for forming a cured object with a high coefficient of refraction, a high coefficient of light penetration, improved strength, and improved resistance to scratching. The invention also relates specifically to a semiconductor device, which possesses high reliability and is covered with the aforementioned cured object.

BACKGROUND ART

Curable organopolysiloxane compositions and curable epoxy resin compositions are used as protective, coating, and sealing agents for semiconductor elements of such semiconductor devices as photocouplers, light-emitting diodes, solid-state imaging devices, etc. It is required that such curable organopolysiloxane compositions and curable epoxy resin compositions neither absorb nor scatter the light emitted or received from a semiconductor element. Furthermore, a cured object produced from these compositions should possess high strength and resistance to scratching.

A cured object obtained from a known curable organopolysiloxane composition comprising an organopolysiloxane with at least two silicon-bonded alkenyl groups per molecule, an organopolysiloxane with at least two silicon-bonded hydrogen atoms, and a hydrosilylation catalyst is characterized by low mechanical strength and low resistance to scratching. As far as the is concerned, with the lapse of time, an object obtained by curing the curable epoxy resin composition changes its color and becomes less permeable to light. This leads to decrease in reliability of semiconductor devices produced with the use of such a composition.

It is an object of this invention to provide a curable organopolysiloxane composition suitable for forming a cured object characterized by a high coefficient of refraction, excellent light permeability, high mechanical strength and resistance to scratching. It is a further object to provide a highly reliable semiconductor device covered with the aforementioned cured object.

DISCLOSURE OF INVENTION

This invention provides a curable organopolysiloxane composition comprising:
(A) a straight-chain organopolysiloxane having per molecule at least two silicon-bonded alkenyl groups and at least one silicon-bonded aryl group;
(B) a branched-chain organopolysiloxane having siloxane units represented by the following general formula $RSiO_{3/2}$ where R is a substituted or unsubstituted monovalent hydrocarbon group, and where component (B) has per molecule at least one silicon-bonded alkenyl group and at least one silicon-bonded aryl group; and where component (B) is used in a weight ratio of 1/99 to 99/1 based on the weight of component (A);
(C) an organopolysiloxane having per molecule at least two silicon-bonded hydrogen atoms; where component (C) is used in an amount of 1 to 200 parts by weight for each 100 parts by weight of total weight of parts (A) and (B); and
(D) a hydrosilylation catalyst in an amount sufficient to promote curing of the composition.

The invention further provides a semiconductor device covered with an object obtained by curing the curable organopolysiloxane composition.

Figure 1:
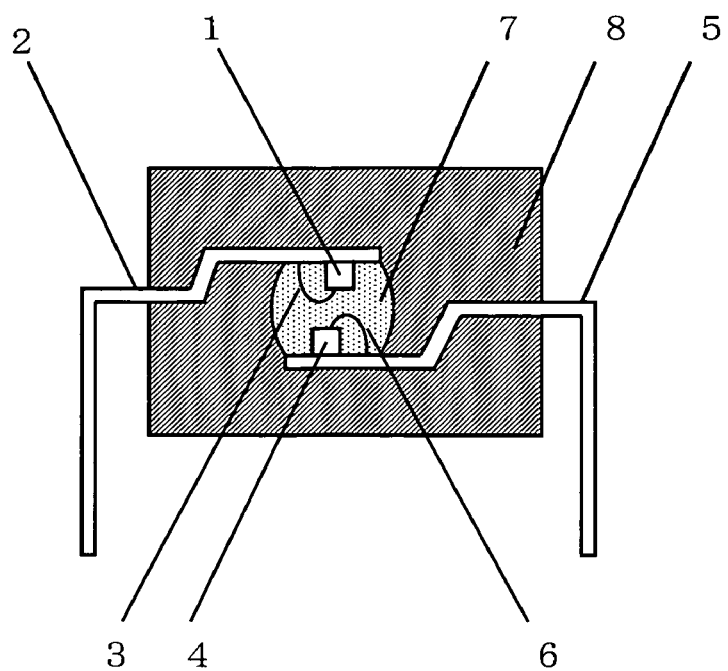
FIG. 1 is a cross-sectional view of a photocoupler as an example of a semiconductor device of the invention.

REFERENCE NUMERALS 1 semiconductor element
2 lead frame
3 bonding wire
4 semiconductor element
5 lead frame
6 bonding wire
7 cured body produced from the curable organopolysiloxane
8 sealing resin
9 semiconductor element
10 lead frame
11 lead frame
12 bonding wire
13 cured body produced from the curable organopolysiloxane composition
14 transparent sealing resin

DETAILED DESCRIPTION OF THE INVENTION

Component (A) comprises a straight-chain organopolysiloxane having per molecule at least two silicon-bonded alkenyl groups and at least one silicon-bonded aryl group. Alkenyl groups contained in component (A) can be represented by vinyl groups, allyl groups, butenyl groups, pentenyl groups, and hexenyl groups. The most preferable are vinyl groups. Aryl groups contained in component (A) can be represented by phenyl groups, tolyl groups, xylyl groups, and naphthyl groups. The most preferable are phenyl groups. Organic groups, other than alkenyl and aryl groups that are silicon-bonded and can be used in component (A) may comprise the following substituted or unsubstituted monovalent hydrocarbon groups: methyl groups, ethyl groups, propyl groups, butyl groups, pentyl groups, hexyl groups, heptyl groups, or similar alkyl groups; benzyl groups, phenethyl groups, or similar aralkyl groups; chloromethyl groups, 3-chloropropyl groups, 3,3,3-trifluoropropyl groups, or similar halogenated alkyl groups. Among these, most preferable are methyl groups. To reduce damping of light under the effect of such phenomena as diffraction, reflection, scattering, etc., that may occur in a cured object obtained from the composition of the invention, it is recommended that the amount of silicon-bonded aryl groups among the silicon-bonded organic groups contained in component (A) be not less than 40 mole %, preferably not less than 45 mole %. Although there are no special restrictions with regard to viscosity of component (A) at 25° C., it is recommended that the viscosity be 10 to 1,000,000 mPa·s, preferably 100 to 50,000 mPa·s. This is because the viscosity of component (A) below the recommended lower limit will decrease mechanical strength of the cured object, while the viscosity above the recommended upper limit will make the composition more difficult to handle.

The organopolysiloxane of component (A) has a straight-chain molecular structure and is expressed by the following general formula:

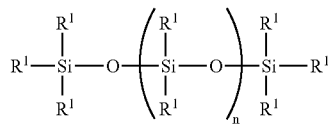

where each $R^1$ may be the same or different and may comprise substituted or unsubstituted monovalent hydrocarbon groups, such as the aforementioned alkyl groups, alkenyl groups, aralkyl groups, and halogenated alkyl groups. Per molecule of this component, at least two $R^1$'s must be alkenyl groups, and at least one of $R^1$ must be an aryl group. In the above formula, n is an integer of 5 to 1000.

Component (B) imparts mechanical strength and high resistance to scratching to an object obtained by curing the composition of the invention. Component (B) is a branched-chain organopolysiloxane with siloxane units represented by the following general formula:

$$RSiO_{3/2}$$

Alkenyl groups contained in component (B) are the same as those defined above. The most preferable are vinyl groups. Aryl groups used in component (B) are also the same as defined above with phenyl groups being preferable. Furthermore, in component (B), silicon-bonded organic groups other than alkenyl groups may comprise the aforementioned alkyl groups, aralkyl groups, halogenated alkyl groups or similar substituted or unsubstituted monovalent hydrocarbon groups. Among these, methyl groups are preferable. R is a substituted or unsubstituted monovalent hydrocarbon group that can be represented by the aforementioned alkyl groups, alkenyl groups, aryl groups, aralkyl groups, and halogenated alkyl groups. Most preferable for R are alkyl and aryl groups, and among these, the methyl and phenyl groups.

The organopolysiloxane can be represented by the following average unit formula:

$$(R^2SiO_{3/2})_a(R^2_2SiO_{2/2})_b(R^2_3SiO_{1/2})_c(SiO_{4/2})_d(XO_{1/2})_e,$$

where each $R^2$ may be the same or different substituted or unsubstituted monovalent hydrocarbon groups, such as the aforementioned alkyl groups, alkenyl groups, aryl groups, aralkyl groups, and halogenated alkyl groups. It is recommended that 0.1 to 40 mole % of all $R^2$'s are alkenyl groups. This is because with the amount of alkenyl groups below the recommended lower limit, component (B) will have low reactivity with respect to component (C). An increase in the amount of alkenyl groups beyond the recommended upper limit will also reduce reactivity to component (C). To reduce the loss of light passing through the cured body of the composition due to refraction, reflection, scattering, etc., it is recommended that more than 10 mole % of all $R^2$'s be the aforementioned aryl groups and preferably phenyl groups. Furthermore, it is recommended that more than 30 mole % of the $R^2$'s contained in the $R^2SiO_{3/2}$ siloxane units of component (C) comprise aryl groups and preferably phenyl groups. In the above formula, groups other than alkenyl groups for $R^2$ are methyl groups. X may designate a hydrogen atom or alkyl group. Examples of the alkyl groups are the same as given above. The most preferable are methyl groups. Furthermore, in the above formula, a is a positive number, b is 0 or a positive number, c is 0 or a positive number, d is 0 or a positive number, e is 0 or a positive number, b/a is 0 to 10, c/a is 0 to 0.5, d/(a+b+c+d) is 0 to 0.3, and e/(a+b+c+d) is 0 to 0.4. Although there are no special restrictions with regard to the molecular weight of component (B), it is recommended to have a weight-average molecular weight ($M_w$) of this component (recalculated to the reference polystyrene) is 500 to 10,000, preferably 700 to 3,000.

In the composition of the invention, component (B) is used in a weight ratio of 1/99 to 99/1, preferably 10/90 to 90/10, and even more preferably, 20/80 to 80/20 to the weight of component (A). If component (B) is used in an amount below the recommended lower limit, a cured object will have a reduced mechanical strength and resistance to scratching. If the amount of component (B) exceeds the recommended upper limit, it would be either difficult to handle the composition, or the obtained cured body will have an extremely high hardness.

Component (C) is a curing agent of the composition. Component (C) is an organopolysiloxane having at least two silicon-bonded hydrogen atoms in one molecule. The organic silicon-bonded groups of component (C) can be represented by the aforementioned alkyl groups, aryl groups, aralkyl groups, halogenated alkyl groups and similar substituted or unsubstituted monovalent hydrocarbon groups, except for alkenyl groups. Among these, preferable are alkyl and aryl groups, especially methyl and phenyl groups. There are no special restrictions about the state of component (C), but preferably it should be in a liquid or solid state at 25° C. Most preferable state is a liquid with the viscosity of 0.1 to 1,000,000,000 mPa·s at 25° C.

The molecular structure of component (C) may be straight, partially-branched straight, branched, or net-like. To impart better mechanical strength and resistance to scratching to a cured object, the branched structure is preferable. Such a branched organopolysiloxane is represented by the following average unit formula:

$$(R^3SiO_{3/2})_f(R^3_2SiO_{2/2})_g(R^3_3SiO_{1/2})_h(SiO_{4/2})_i(X'O_{1/2})_j,$$

where each $R^3$ may be the same or different and may comprise hydrogen atoms or substituted or unsubstituted monovalent hydrocarbon groups, except for alkenyl groups. Examples of such monovalent hydrocarbon groups are the aforementioned alkyl groups, aryl groups, aralkyl groups, and halogenated alkyl groups. It is preferable to have silicon-bonded hydrogen atoms in an amount of 0.1 to 40 mole % of all $R^3$'s. If the content of silicon-bonded hydrogen atoms is below the recommended lower limit, the composition will be difficult to cure. If the recommended upper limit is exceeded, a cured object will have a reduced thermal resistance. To reduce the loss of light passing through the cured body of the composition due to refraction, reflection, scattering, etc., it is recommended that 10 mole % or more of all $R^3$'s be the aforementioned aryl groups and preferably phenyl groups. Furthermore, it is recommended that 30 mole % or more of the $R^2$'s contained in the $R^3SiO_{3/2}$ siloxane units of component (C) comprise aryl groups and preferably phenyl groups. In the above formula, groups other than aryl groups and hydrogen atoms that may contain R³'s are methyl groups; X' may designate a hydrogen atom or alkyl groups. Examples of the alkyl groups are the same as given above. The most preferable are methyl groups. Furthermore, in the above formula, f is a positive number, g is 0 or a positive number, h is 0 or a positive number, i is 0 or a positive number, j is 0 or a positive number, g/f is 0 to 10, h/f is 0 to 0.5, i/(f+g+h+i) is 0 to 0.3, and j/(f+g+h+i) is 0 to 0.4. Although there are no special restrictions with regard to the molecular weight of component (C), it is recommended to have a weight-average molecular weight ($M_w$) of this component (recalculated to the reference polystyrene) within the range of 300 to 10,000, preferably 500 to 3,000.

Component (C) is used in an amount of 1 to 200 parts by weight for each 100 parts by weight of the sum of components (A) and (B). If the amount of component (C) is below the recommended lower limit, it will be difficult to provide sufficient curing of the composition. If component (C) is used in an amount exceeding the recommended upper limit, the cured product will have insufficient thermal resistance. For the above reasons, it is recommended that the silicon-bonded hydrogen atoms in the component (C) are preferably within a range of 0.1 to 10 moles, more preferably within a range of 0.1 to 5 moles, and even more preferably within a range of 0.5 to 5 moles, per 1 mole of the sum of alkenyl groups contained in components (A) and (B).

Component (D) is catalyst for a hydrosilylation reaction between alkenyl groups of components (A) and (B) and silicon-bonded hydrogen atoms of component (C). In other words, component (D) is a hydrosilylation catalyst that accelerates curing of the composition. Examples of component (D) are platinum-type catalysts, rhodium-type catalysts, and palladium-type catalysts, of which platinum-type catalysts are most preferable. The following are examples of the platinum catalyst suitable for the invention: platinum fine powder, chloroplatinic acid, alcoholic solution of the chloroplatinic acid, a platinum-alkenylsiloxane complex, platinum-olefin complex, platinum-carbonyl complex. The most preferable is the platinum-alkenylsiloxane complex. The alkenylsiloxane can be represented by the following compounds: 1,3-divinyl-1,1,3,3-tetramethyldisiloxane, 1,3,5,7-tetramethyl-1,3,5,7-tetravinyl cyclotetrasiloxane, alkenylsiloxane having a part of methyl groups of the alkenylsiloxane substituted by ethyl groups, phenyl groups or the like, and alkenylsiloxane having vinyl groups of the alkenylsiloxane substituted by allyl groups, hexenyl groups, or the like. Among these, the most preferable is 1,3-divinyl-1,1,3,3-tetramethyldisiloxane that imparts high stability to the platinum-alkenylsiloxane complex. For further improvement in the stability of the platinum-alkenylsiloxane complexes, it is recommended to combine the aforementioned complexes with organosiloxane oligomers such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, or 1,3,5,7-tetramethyl-1,3,5,7-tetravinyl cyclotetrasiloxane, or a similar alkenylsiloxane or methylsiloxane oligomer. The most preferable for the addition is alkenylsiloxane.

There are no special limitations with regard to the amount of component (D) required for acceleration of curing of the composition. The most preferable amount provides a content of metal atoms contained (in weight units) in component (D) of 0.01 to 1,000 ppm. If component (D) is contained in an amount below the recommended lower limit, it would be difficult to ensure sufficient curing, while with the amount of component (D) exceeding the recommended upper limit, there may be problems associated with coloration of the cured object.

If necessary, the composition may be combined with other optional components such as 2-methyl-3-butyn-2-ol, 3,5-dimethyl-1-hexyn-3-ol, 2-phenyl-3-butyn-2-ol, or similar alkynyl alcohols; 3-methyl-3-penten-1-yne, 3,5-dimethyl-3-hexen-1-yne, or a similar enyne compound; 1,3,5,7-tetramethyl-1,3,5,7-tetravinylcyclotetrasiloxane, 1,3,5,7-tetramethyl-1,3,5,7-tetrahexenylcyclotetrasiloxane, benzotriazole, or a similar hydrosilylation reaction inhibitor. Although there are no special restriction with regard to the amount of the aforementioned reaction inhibitors added to the composition, it is recommended to use these inhibitors in an amount of 0.0001 to 5 parts by weight for each 100 parts by weight of the sum of the amounts of components (A) and (B).

If necessary, an adhesion-imparting agent can be added to the composition of the invention for improving its adhesive properties. Such an agent may comprise an organic silicon compound which is different from aforementioned components (A), (B), and (C) and which contains at least one silicon-bonded alkoxy group per molecule. This alkoxy group can be represented by a methoxy group, ethoxy group, propoxy group, butoxy group, and a methoxyethoxy group. A methoxy group is the most preferable. Groups other than the aforementioned silicon-bonded alkoxy groups of the organic silicon compound also can be used. Examples of such other groups are the following: substituted or unsubstituted monovalent hydrocarbon groups such as the aforementioned alkyl groups, alkenyl groups, aryl groups, aralkyl groups; 3-glycidoxypropyl groups, 4-glycidoxybutyl groups, or similar glycidoxyalkyl groups; 2-(3,4-epoxycyclohexyl) ethyl groups, 3-(3,4-epoxycyclohexyl) propyl groups, or similar epoxycyclohexyl groups; 4-oxiranylbutyl groups, 8-oxiranyloctyl groups, or similar oxiranylalkyl groups, or other epoxy-containing monovalent organic groups; 3-methacryloxypropyl groups, or similar acryl-containing monovalent organic groups; and hydrogen atoms. At least one of these groups can be contained in one molecule. The most preferable are epoxy-containing and acryl-containing monovalent organic groups. It is recommended that the aforementioned organic silicon compounds contain groups to react with components (A) and (B), or (C), in particular such groups as silicon-bonded alkenyl groups and silicon-bonded hydrogen atoms. For better adhesion to various materials, it is preferable to use the aforementioned organic silicon compounds that have at least one epoxy-containing monovalent group per molecule. Examples of such compounds are organosilane compounds and organosiloxane oligomers. The aforementioned organosilane oligomers may have a straight-chain, partially-branched straight-chain, branched-chain, cyclic, and net-like molecular structure. The straight-chain, branched-chain, and net-like structures are preferable. The following are examples of the aforementioned organic silicon compounds: 3-glycidoxypropyltrimethoxysilane, 2-(3,4-epoxycyclohexyl) ethyltrimethoxysilane, 3-methacryloxypropyltrimethoxysilane, or similar silane compounds; a siloxane compound having in one molecule at least one silicon-bonded alkenyl group, or at least one silicon-bonded hydrogen atom, or at least one silicon-bonded alkoxy group, a silane compound having at least one silicon-bonded alkoxy group, a mixture of a silane or a siloxane compound having at least one silicon-bonded alkoxy group with a siloxane compound having in one molecule at least one silicon-bonded hydroxyl group and at least one silicon-bonded alkenyl group, a siloxane compound represented by the following formula:

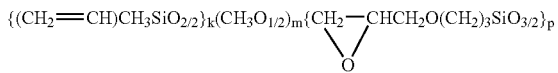

where k, m, and p are positive numbers, and a siloxane represented by the following formula:

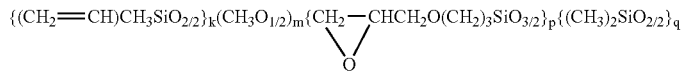

where k, m, p, and q are positive numbers. It is recommended that the aforementioned adhesion-imparting agents be in a low-viscosity state. There are no special restrictions with regard to the value of the viscosity. However, it is recommended for viscosity to be 1 to 500 mPa·s at 25° C. Although there are no special restrictions with regard to the content of the adhesion-imparting agent in the composition, it is recommended to use it in the amount of 0.01 to 10 parts by weight for each 100 parts by weight of the sum of components (A) and (B).

If the composition of the invention is used as a protective agent for a semiconductor element of a light-emitting diode (LED), it may contain a luminescent substance, e.g., of a yttrium-aluminum-garnet system. Although there are no special restrictions with regard to the content of the luminescent substance, the recommended range is 1 to 20 wt. %, preferably, 5 to 15 wt. % of the total weight of the composition. Within limits not conflicting with the objects of the invention, the composition may further comprise other optional additives, such as silica, glass, alumina, zinc oxide, or similar inorganic fillers; polymethacrylate resin, or a similar organic resin in the form of a fine powder; heat-resistant agents, dyes, pigments, flame retarders, solvents, etc.

It is recommended that the index of refraction (at 25° C.) for visible light (589 nm) passing through the cured body obtained from the composition of the invention be not less than 1.5. It is also recommended that light permeability (at 25° C.) for the visible light (420 nm) passing through the cured body obtained from the composition of the invention, be not less than 80%. This is because it would be difficult, with the index of refraction below 1.5 or with light permeability below 80%, to impart sufficient reliability to a semiconductor device that incorporates a semiconductor element coated with a cured body of the composition. To obtain a curable organopolysiloxane composition suitable for forming a cured body with such high values of the index of refraction and light permeability, it is recommended that all components (A) to (C) have substantially the same index of refraction. More specifically, it is recommended that among all organic groups component (A) contain 40 mole % or more, preferably 45 mole % or more of silicon-bonded aryl groups and that silicon-bonded organic groups other than the aforementioned aryl and alkenyl groups comprise alkyl groups, in particular methyl-containing organopolysiloxanes. For the same purpose, it is recommended that among all organic groups component (B) contain 10 mole % of silicon-bonded aryl groups and that silicon-bonded organic groups, other than the aforementioned aryl and alkenyl groups, comprise alkyl groups, in particular methyl-containing organopolysiloxanes. For the same purpose, it is recommended that among all organic groups component (C) contain 10 mole % of silicon-bonded aryl groups and that silicon-bonded organic groups, other than the aforementioned aryl groups, comprise alkyl groups, in particular methyl-containing organopolysiloxanes. The index of refraction can be measured, e.g., by the Abbe refractometer. In this case, indices of refraction can be measured at different wavelengths by changing the wavelength of a light source used in the Abbe refractometer. Furthermore, light permeability, e.g., for a cured body with optical path length of 1.0 mm, can be measured with the use of a spectrophotometer.

It is also recommended that at 25° C. permeability of ultraviolet (UV) rays with wavelengths of 200 nm to 250 nm through a cured body obtained from the composition of the invention do not exceed 10%. This is because otherwise it would be impossible to protect the structural material of the semiconductor device that incorporates a semiconductor element coated with a cured body of the composition of the invention from deterioration under the effect of UV rays of a short wavelength in the range of 200 nm to 250 nm. UV light permeation can be measured, e.g., in a cured body with a 1.0 mm optical path, with the use of a spectrophotometer.

The composition of the invention can be cured at room temperature or with heating. Curing with heating is recommended for acceleration of the process. The temperature recommended for curing with heating is 50 to 200° C. A cured body obtained by curing the composition of the invention may have a rubber-like structure, in particular, the structure of hard rubber or a flexible resin. In the manufacture of electric and electronic devices, the composition of the invention is suitable for use as an adhesive agent, bonding agent, protective agent, coating agent, sealing agent, and an underfill agent. In particular, the compositions of the invention are most suitable as protective, coating, and sealing agents for use with semiconductor elements of optical semiconductor devices operating under conditions of high light permeation.

The following is a detailed description of a semiconductor device of the invention. The device of the invention is characterized by having a semiconductor element coated with a cured body made from the curable organopolysiloxane composition of the invention. The aforementioned semiconductor element may comprise a diode, transistor, thyristor, solid-state image pickup element, as well as a semiconductor element of a monolithic IC or a hybrid IC. Furthermore, the aforementioned semiconductor device may comprise an optical semiconductor device, such as a diode, a light-emitting diode (LED), transistor, thyristor, photocoupler, charge coupled device (CCD), monolithic IC, hybrid IC, LSI, and VLSI. Optical semiconductor devices most suitable for application of the invention are light-emitting diodes (LED's) and photocouplers.

Figure 2:
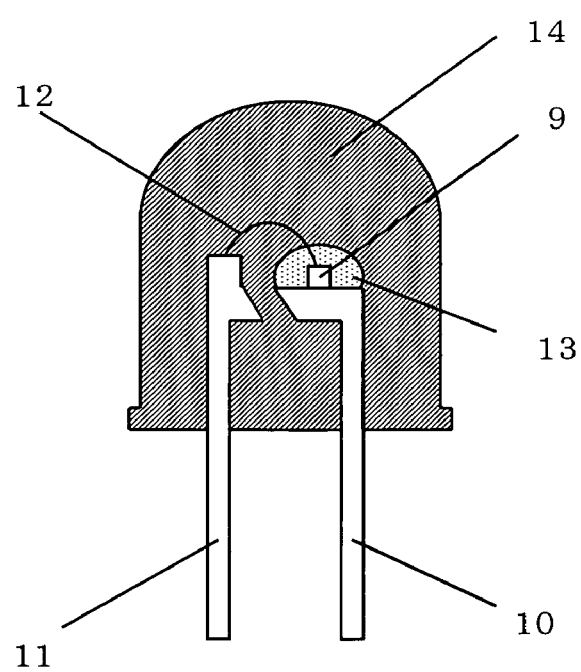
FIG. 2 is a cross-sectional view of a LED as an example of a semiconductor device of the invention.

FIG. 1 is a cross-sectional view of a photocoupler shown as one example of the device of the invention, and FIG. 2 is a cross-sectional view of a single LED used in the aforementioned device. The photocoupler shown in FIG. 1 contains a semiconductor element 1 formed by a compound semiconductor body and attached to a lead frame 2 by die-bonding and by a bonding wire 3 to another lead frame 2 not shown in the drawings. A light-receiving semiconductor element 4 located opposite to the semiconductor element 1 is die-bonded to a lead frame 5 and by a bonding wire 6 to another lead frame 5 not shown in the drawing. The space between the semiconductor elements is filled with a transparent cured body 7 of a curable organopolysiloxane composition of the invention. Furthermore, the semiconductor element covered by the cured body 7 is sealed with the use of the sealing resin 8.

In the production of the photocoupler shown in FIG. 1, the semiconductor element 1 is die-bonded to the lead frame 2, and then the semiconductor element 1 and another separate lead frame 2 (which is not shown in FIG. 1) are wire-bonded with the use of a bonding wire 3 made of gold. In a similar manner, a light-receiving semiconductor element 4, which is located opposite to the semiconductor element 1, is die-bonded to the lead frame 5, and then the semiconductor element 4 and another separate lead frame 5 (which is not shown in FIG. 1) are wire-bonded with the use of a bonding wire 6 made of gold. After filling the space between the semiconductor elements with the curable organopolysiloxane composition of the invention, the composition is cured by heating at 50° C. to 200° C. The semiconductor elements embedded in the transparent cured body 7 of the aforementioned curable organopolysiloxane composition are then sealed in a white epoxy resin cover 8.

On the other hand, a LED of the type shown in FIG. 2 contains a semiconductor element 9, which is die-bonded to a lead frame 10 and wire-bonded to a lead frame 11 by a bonding wire 12. The aforementioned semiconductor element 9 is coated with a cured body 13 of the curable organopolysiloxane composition of the invention which contains 5 to 15 wt. % of a luminescent substance (YAG). The semiconductor element 9 coated with the cured body 13 is, in turn, sealed by embedding in a transparent sealing resin 14, in particular in an cured body of a curable organopolysiloxane composition of the invention, but without a luminescent substance.

In the production of the LED shown in FIG. 2, the semiconductor element 9 is die-bonded to the lead frame 10, and then the semiconductor element 9 is wire-bonded to a lead frame 11 with the use of a bonding wire 12 made of gold. The semiconductor element 9 is then coated with the curable organopolysiloxane composition of the invention that contains 5 to 15 wt. % of a luminescent substance (YAG), and the composition is cured by heating at 50° C. to 200° C. The semiconductor element 9 coated with the cured body 13 of the aforementioned curable organopolysiloxane composition is then sealed in a curable organopolysiloxane composition of the invention, but without a luminescent substance.

EXAMPLES

The curable organopolysiloxane composition and the semiconductor elements of the invention will be further described in more detail with reference to practical examples. Values of viscosity used in the practical examples were measured at 25° C. Characteristics of the curable organopolysiloxane composition and of the semiconductor elements were measured by the methods described below.

Hardness of the Cured Body

The cured body was obtained by heating the curable organopolysiloxane composition for 1 hour at 150° C. in a hot-air-circulation oven. The hardness of the cured body was measured by means of a Type A durometer specified by JIS K 6253.

Tensile Strength

A cured body having the shape of a dumbbell-type specimen No. 3 according to JIS K 6251 was produced by heating the curable organopolysiloxane composition for 1 hour at 150° C. in a hot-air-circulation oven. The tensile strength of the cured body was measured with a procedure specified in JIS K 6251.

Resistance to Scratching

The curable organopolysiloxane composition was poured onto an aluminum plate (55 mm diameter) so as to form a 1 mm-thick layer, and the content of the plate was cured by heating at 150° C. for 1 hour in a hot-air-circulation oven. As a result, a plate-like cured body was formed. The surface of this plate was scratched 10 times with a nail, and then the degree of the surface damage was evaluated. The following designations were used for evaluation criteria: ○—no scratches after 10 times; Δ—scratches after 2 to 10 times; X—scratch after 1 time. Furthermore, appearance of the sample was observed after 100 hour treatment at 150° C. in a hot-air-circulation oven.

Index of Refraction through the Curable Organopolysiloxane Composition and Cured Body Index of refraction through the curable organopolysiloxane composition at 25° C. was measured with the Abbe refractometer. Measurements were carried out with a visible light (589 nm). The curable organopolysiloxane composition was then cured by heating for 1 hour at 150° C. in a hot-air-circulation oven, and the index of refraction at 25° C. for the light passing through the obtained cured body was measured in the same manner as for the composition.

Visible Light Permeability through the Curable Organopolysiloxane Composition and Cured Body Visible light permeability through a curable organopolysiloxane composition (optical path length 1.0 mm) at 25° C. was measured. Measurements were carried out with visible light with the wavelength of 420 nm. The curable organopolysiloxane composition was then cured by heating for 1 hour at 150° C. in a hot-air-circulation oven, and permeability of light through the cured body at 25° C. (optical path length 1.0 mm) was measured.

Ultraviolet Light Permeability through the Curable Organopolysiloxane Composition and Cured Body Permeability of ultraviolet light (with wavelength of 230 nm) through a curable organopolysiloxane composition (optical path length 1.0 mm) at 25° C. was measured by means of a spectrophotometer. The curable organopolysiloxane composition was then cured by heating for 1 hour at 150° C. in a hot-air-circulation oven, and permeability of ultraviolet light through the cured body at 25° C. (optical path length 1.0 mm) was measured.

The following procedures were used for evaluating reliability of the semiconductor device.

Reliability Evaluation Procedure No. 1

The photocoupler shown in FIG. 1 was produced in the following manner. A Ga—Al—As type semiconductor element 1 was die-bonded to a lead frame 2 by means of a conductive paste. The semiconductor element 1 and another lead frame 2 were then wire-bonded to each other with the use of a bonding wire 3 made of gold. A light-receiving semiconductor element 4 located opposite to the semiconductor element 1 was wire-bonded to a lead frame 5 by means of a bonding wire 6 made of gold. The space between the electrodes was filled with the curable organopolysiloxane composition, which was then cured for 1 hours at 150° C. in a hot-air-circulation oven. The semiconductor elements coated with a cured body 7 of the aforementioned composition were then sealed in a white epoxy resin 8. Ten photocouplers were produced by the method described above. Light-generation power of each photocoupler was measured prior to and after heat treatment during 100 hours at 150° C. in a hot-air-circulation oven, and an average value of the light-generation power developed by the photocouplers after the heat treatment was calculated in a ratio relative to the light-generation power prior to the heat treatment, which was assumed as 100.

Reliability Evaluation Procedure No. 2

The LED shown in FIG. 2 was produced in the following manner. A Ga—N type semiconductor element 9 was die-bonded to a lead frame 10 by means of a conductive paste. The semiconductor element 9 and a lead frame 11 were then wire-bonded to each other with the use of a bonding wire 12 made of gold. The semiconductor element 9 was coated with the curable organopolysiloxane composition that contained 10 wt. % of a luminescent substance (YAG), and the composition was then cured for 1 hour at 150° C. in a hot-air-circulation oven. The semiconductor element 9 coated with a cured body 13 of the aforementioned composition was then sealed in a transparent sealing resin 14 prepared from the same organopolysiloxane composition as above but without the luminescent substance. Sealing was carried out by heating for 1 hour at 150° C. in a hot-air-circulation oven. Ten such LED's were produced by the method described above. Light-emitting power of each LED was measured prior to and after heat treatment of the LED during 100 hours at 150° C. in a hot-air-circulation oven, and an average value of the light-generation power developed by the LED after the heat treatment was calculated in a ratio relative to the light-generation power prior to the heat treatment which was assumed as 100.

Practical Example 1

A 3,250 mPa·s viscosity, curable organopolysiloxane composition was prepared by uniformly mixing:

45 parts by weight of 3,500 mPa·s viscosity, straight-chain methylphenylpolysiloxane having both molecular terminals capped with dimethylvinylsiloxy groups with 0.20 wt. % content of silicon-bonded vinyl groups and 49 mole % of silicon-bonded phenyl groups among all silicon-bonded organic groups, 20 parts by weight of a branched-chain organopolysiloxane having the following average unit formula:

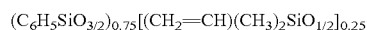
(C$_6$H$_5$SiO$_{3/2}$)$_{0.75}$[(CH$_2$=CH)(CH$_3$)$_2$SiO$_{1/2}$]$_{0.25}$ having a solid state at 25° C., containing 20 mole % of silicon-bonded vinyl groups and 50 mole % of silicon-bonded phenyl groups of all the silicon-bonded organic groups, and having a weight-average molecular weight referenced to polystyrene of 1,600, 30 parts by weight of a 950 mPa·s branch-chain organopolysiloxane having the following average unit formula:

(C$_6$H$_5$SiO$_{3/2}$)$_{0.60}$[(CH$_3$)$_2$HSiO$_{1/2}$]$_{0.40}$ containing 20 mole % of silicon-bonded hydrogen atoms and 33 mole % of silicon-bonded phenyl groups among all silicon-bonded groups, having a weight-average molecular weight referenced to polystyrene of 1,100 and where the amount of silicon-bonded hydrogen atoms was 1.3 moles per 1 mole of the silicon-bonded vinyl groups contained in the aforementioned methylphenylpolysiloxane and the branch-chain organopolysiloxane, a complex of platinum with 1,3-divinyl-1,1,3,3-tetramethyldisiloxane in such an amount that in weight units metallic platinum comprised 2.5 ppm, and 0.05 parts by weight of 2-phenyl-3-butyn-2-ol.

Characteristics of the curable organopolysiloxane composition and of the cured body were measured. The results of measurement are presented in Table 1. Furthermore, a photocoupler and LED were manufactured with the use of the aforementioned organopolysiloxane composition. Table 1 also contains results of evaluating reliability of the obtained semiconductors.

Comparative Example 1

A 4,500 mPa·s viscosity, curable organopolysiloxane composition was prepared by uniformly mixing:

75 parts by weight of 3,500 mPa·s viscosity, straight-chain methylphenylpolysiloxane having both molecular terminals capped with dimethylvinylsiloxy groups containing 0.20 wt. % content of silicon-bonded vinyl groups and 49 mole % of silicon-bonded phenyl groups among all silicon-bonded organic groups, 17 parts by weight of a 950 mPa·s viscosity, branched-chain organopolysiloxane having the following average unit formula:

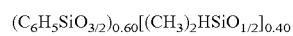
(C$_6$H$_5$SiO$_{3/2}$)$_{0.60}$[(CH$_3$)$_2$HSiO$_{1/2}$]$_{0.40}$ containing 20 mole % of silicon-bonded hydrogen atoms and 33 mole % of silicon-bonded phenyl groups among all silicon-bonded groups, having a weight-average molecular weight referenced to polystyrene of 1,100, where the amount of silicon-bonded hydrogen atoms was 1.3 moles per 1 mole of the silicon-bonded vinyl groups contained in the aforementioned methylphenylpolysiloxane, a complex of platinum with 1,3-divinyl-1,1,3,3-tetramethyldisiloxane in such an amount that in weight units metallic platinum comprised 2.5 ppm, and 0.05 parts by weight of 2-phenyl-3-butyn-2-ol.

Characteristics of the curable organopolysiloxane composition and of the cured body were measured. The results of measurement are presented in Table 1. Furthermore, a photocoupler and LED were manufactured with the use of the aforementioned organopolysiloxane composition. Table 1 also contains results of evaluating reliability of the obtained semiconductors.

Comparative Example 2

A 2,000 mPa·s viscosity, curable organopolysiloxane composition was prepared by uniformly mixing 52 parts by weight of a branch-chain organopolysiloxane having the following average unit formula:

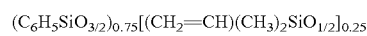
(C$_6$H$_5$SiO$_{3/2}$)$_{0.75}$[(CH$_2$=CH)(CH$_3$)$_2$SiO$_{1/2}$]$_{0.25}$ having a solid state at 25° C., containing 20 mole % of silicon-bonded vinyl groups and 50 mole % of silicon-bonded phenyl groups of all the silicon-bonded organic groups, and having a weight-average molecular weight referenced to polystyrene of 1,600, 43 parts by weight of a 950 mPa·s viscosity, branch-chain organopolysiloxane having the following average unit formula:

$$(C_6H_5SiO_{3/2})_{0.60}[(CH_3)_2HSiO_{1/2}]_{0.40}$$

containing 20 mole % of silicon-bonded hydrogen atoms and 33 mole % of silicon-bonded phenyl groups among all silicon-bonded groups, having a weight-average molecular weight referenced to polystyrene of 1,100, and where the amount of silicon-bonded hydrogen atoms was 1.3 moles per 1 mole of the silicon-bonded vinyl groups contained in the aforementioned branch-chain organopolysiloxane, a complex of platinum with 1,3-divinyl-1,1,3,3-tetramethyldisiloxane in such an amount that in weight units metallic platinum comprised 2.5 ppm, and 0.05 parts by weight of 2-phenyl-3-butyn-2-ol.

Characteristics of the curable organopolysiloxane composition and of the cured body were measured. The results of measurement are presented in Table 1. Furthermore, a photocoupler and LED were manufactured with the use of the aforementioned organopolysiloxane composition. Table 1 also contains results of evaluating reliability of the obtained semiconductors.

Practical Example 2

A 3,500 mPa·s viscosity, curable organopolysiloxane composition was prepared by uniformly mixing 61.5 parts by weight of 3,500 mPa·s viscosity, straight-chain methylphenylpolysiloxane having both molecular terminals capped with dimethylvinylsiloxy groups (with 0.20 wt. % content of silicon-bonded vinyl groups and 49 mole % of silicon-bonded phenyl groups), 20.3 parts by weight of a branched-chain organopolysiloxane having the following average unit formula:

$$(C_6H_5SiO_{3/2})_{0.75}[(CH_2\!=\!CH)(CH_3)_2SiO_{1/2}]_{0.25}$$

having a solid state at 25° C., and containing 20 mole % of silicon-bonded vinyl groups and 50 mole % of silicon-bonded phenyl groups among all silicon-bonded organic groups, and having a weight-average molecular weight referenced to polystyrene of 1,600), 12.8 parts by weight of a 20 mPa·s branch-chain organopolysiloxane having the following average unit formula:

$$(SiO_{4/2})_{0.60}[(CH_3)_2HSiO_{1/2}]_{0.40}$$

containing 33 mole % of silicon-bonded hydrogen atoms among all silicon-bonded groups, such that the amount of silicon-bonded hydrogen atoms was 1.3 moles per 1 mole of the silicon-bonded vinyl groups contained in the aforementioned methylphenylpolysiloxane and the branch-chain organopolysiloxane, a complex of platinum with 1,3-divinyl-1,1,3,3-tetramethyldisiloxane in such an amount that in weight units metallic platinum comprised 2.5 ppm, and 0.05 parts by weight of 2-phenyl-3-butyn-2-ol.

Characteristics of the curable organopolysiloxane composition and of the cured body were measured. The results of measurement are presented in Table 1. Furthermore, a photocoupler and LED were manufactured with the use of the aforementioned organopolysiloxane composition. Table 1 also contains results of evaluating reliability of the obtained semiconductors.

TABLE 1

| Characteristics | Practical Examples 1 | Practical Examples 2 | Comparative Examples 1 | Comparative Examples 2 |
|---|---|---|---|---|
| Curable Organopolysiloxane | | | | |
| Index of Refraction | 1.54 | 1.53 | 1.54 | 1.54 |
| Light permeability (%) | 100 | 31 | 100 | 100 |
| Cured Body | | | | |
| Hardness | 65 | 70 | 45 | 95 |
| Tensile Strength (Mpa) | 1.8 | 0.8 | 0.23 | 0.11 |
| Resistance to Scratching | ○ | ○ | X | ○ |
| Index of Refraction | 1.54 | 1.53 | 1.54 | 1.54 |
| Light permeability (%) | 100 | 85 | 97 | 92 |
| UV Light permeability (%) | 0 | 0 | 0 | 0 |
| Reliability of Semiconductor Evaluation Method No. 1 | | | | |
| Relative Light-Generation Power (%) | 100 | 100 | 84 | 45* |
| Evaluation Method No. 2 | | | | |
| Relative Light-Generation Power (%) | 100 | 100 | 72 | 43* |

*Surface cracks developed on all specimens after 100 hours of heat treatment at 150° C.

INDUSTRIAL APPLICABILITY

The curable organopolysiloxane composition of the invention is characterized by high coefficient of refraction, permeability of light, and mechanical strength. A cured body of the composition is characterized by good resistance to scratching. Furthermore, as the semiconductor devices of the invention are covered with a cured body of the aforementioned composition, they have excellent reliability.

The invention claimed is:

1. A curable organopolysiloxane composition comprising:
(A) a straight-chain organopolysiloxane having per molecule at least two silicon-bonded alkenyl groups and at least one silicon-bonded aryl group;
(B) a branched-chain organopolysiloxane having an average unit formula:

$$(R^2SiO_{3/2})_a(R^2{}_2SiO_{2/2})_b(R^2{}_3SiO_{1/2})_c(SiO_{4/2})_d(XO_{1/2})_e$$

where each $R^2$ is the same or different substituted or unsubstituted monovalent hydrocarbon group, 0.1 to 40 mole % of all $R^2$'s are alkenyl groups, more than 10 mole % of all $R^2$'s are aryl groups, X is a hydrogen atom or an alkyl group, a is a positive number, b is 0 or a positive number, c is 0 or a positive number, d is 0 or a positive number, e is 0 or a positive number, b/a is 0 to 10, c/a is 0 to 0.5, d/(a+b+c+d) is 0 to 0.3, and e/(a+b+c+d) is 0 to 0.4, and where component (B) is used in a weight ratio of 1/99 to 99/1 based on the weight of component (A);

(C) an organopolysiloxane having per molecule at least two silicon-bonded hydrogen atoms, where component (C) is used in an amount of 1 to 200 parts by weight for each 100 parts by weight of the total weight of parts (A) and (B); and (D) a hydrosilylation catalyst in an amount sufficient to promote curing of the composition.

2. The curable organopolysiloxane composition of claim 1, where component (A) has a content of silicon-bonded aryl groups not less than 40 mole % of all silicon-bonded organic groups in component (A).

3. The curable organopolysiloxane composition of claim 1, where component (A) is an organopolysiloxane represented by the general formula:

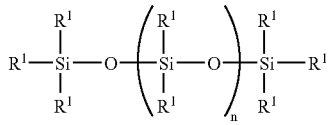

where each $R^1$ comprises the same or different substituted or unsubstituted monovalent hydrocarbon groups, at least two $R^1$'s comprise alkenyl groups, at least one $R^1$ comprises an aryl group, and n is an integer from 5 to 1000.

4. The curable organopolysiloxane composition of claim 1, where all or a portion of component (C) has average unit formula:

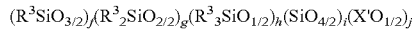

where each $R^3$ is the same or different substituted or unsubstituted monovalent hydrocarbon groups except for alkenyl groups, or hydrogen atoms; 0.1 to 40 mole % of all $R^3$'s are hydrogen atoms; more than 10 mole % of all $R^3$'s are aryl groups; X' is a hydrogen atom or an alkyl group, f is a positive number, g is 0 or a positive number, h is 0 or a positive number, i is 0 or a positive number, j is 0 or a positive number, g/f is 0 to 10, h/f is 0 to 0.5, i/(f+g+h+i) is 0 to 0.3, and j/(f+g+h+i) is 0 to 0.4.

5. The curable organopolysiloxane composition of claim 1, where an index of refraction at 25° C. for visible light having a wavelength of 589 nm passing through an object obtained by curing the curable organopolysiloxane composition of claim 1 is equal to or exceeds 1.5.

6. The curable organopolysiloxane composition of claim 1, where light permeability at 25° C. for visible light passing through an object obtained by curing the curable organopolysiloxane composition of claim 1 is equal to or exceeds 80%.

7. A curable organopolysiloxane composition comprising:
(A) a straight-chain organopolysiloxane having per molecule at least two silicon-bonded alkenyl groups and at least one silicon-bonded aryl group;
(B) a branched-chain organopolysiloxane with siloxane units represented by the general formula:

where R is a substituted or unsubstituted monovalent hydrocarbon group, and where component (B) has per molecule, at least one silicon-bonded alkenyl group and at least one silicon-bonded aryl group, and where component (B) is used in a weight ratio of 1/99 to 99/1 based on the weight of component (A);
(C) an organopolysiloxane having per molecule at least two silicon-bonded hydrogen atoms, where all or a portion of component (C) has an average unit formula:

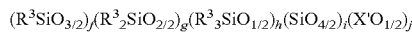

where each $R^3$ is the same or different substituted or unsubstituted monovalent hydrocarbon groups except for alkenyl groups, or hydrogen atoms; 0.1 to 40 mole % of all $R^3$'s are hydrogen atoms; more than 10 mole % of all $R^3$'s are aryl groups; X' is a hydrogen atom or an alkyl group, f is a positive number, g is 0 or a positive number, h is 0 or a positive number, i is 0 or a positive number, j is 0 or a positive number, g/f is 0 to 10, h/f is 0 to 0.5, i/(f+g+h+i) is 0 to 0.3, and j/(f+g+h+i) is 0 to 0.4, and where component (C) is used in an amount of 1 to 200 parts by weight for each 100 parts by weight of the total weight of parts (A) and (B); and
(D) a hydrosilylation catalyst in an amount sufficient to promote curing of the composition.

8. The curable organopolysiloxane composition of claim 7, where component (A) has a content of silicon-bonded aryl groups not less than 40 mole % of all silicon-bonded organic groups in component (A).

9. The curable organopolysiloxane composition of claim 7, where component (A) is an organopolysiloxane represented by the general formula:

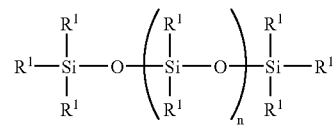

where each $R^1$ comprises the same or different substituted or unsubstituted monovalent hydrocarbon groups, at least two $R^1$'s comprise alkenyl groups, at least one $R^1$ comprises an aryl group, and n is an integer from 5 to 1000.

10. A curable organopolysiloxane composition comprising:
(A) a straight-chain organopolysiloxane having per molecule at least two silicon-bonded alkenyl groups and at least one silicon-bonded aryl group;
(B) a branched-chain organopolysiloxane with siloxane units represented by the general formula:

where R is a substituted or unsubstituted monovalent hydrocarbon group, and where component (B) has per molecule, at least one silicon-bonded alkenyl group and at least one silicon-bonded aryl group, and where component (B) is used in a weight ratio of 1/99 to 99/1 based on the weight of component (A);
(C) an organopolysiloxane having per molecule at least two silicon-bonded hydrogen atoms, where component (C) is used in an amount of 1 to 200 parts by weight for each 100 parts by weight of the total weight of parts (A) and (B); and
(D) a hydrosilylation catalyst in an amount sufficient to promote curing of the composition;
where an index of refraction at 25° C. for visible light having a wavelength of 589 nm passing through an object obtained by curing the curable organopolysiloxane composition is equal to or exceeds 1.5.

11. The curable organopolysiloxane composition of claim 10, where component (A) has a content of silicon-bonded aryl groups not less than 40 mole % of all silicon-bonded organic groups in component (A).

12. The curable organopolysiloxane composition of claim 10, where component (A) is an organopolysiloxane represented by the general formula:

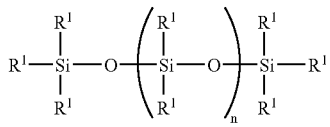

where each $R^1$ comprises the same or different substituted or unsubstituted monovalent hydrocarbon groups, at least two $R^1$'s comprise alkenyl groups, at least one $R^1$ comprises an aryl group, and n is an integer from 5 to 1000.

13. The curable organopolysiloxane composition of claim 10, where light permeability at 25° C. for visible light passing through an object obtained by curing the curable organopolysiloxane composition of claim 17 is equal to or exceeds 80%.

14. A curable organopolysiloxane composition comprising:
(A) a straight-chain organopolysiloxane having per molecule at least two silicon-bonded alkenyl groups and at least one silicon-bonded aryl group;
(B) a branched-chain organopolysiloxane with siloxane units represented by the general formula:

$RSiO_{3/2}$ where R is a substituted or unsubstituted monovalent hydrocarbon group, and where component (B) has per molecule, at least one silicon-bonded alkenyl group and at least one silicon-bonded aryl group, and where component (B) is used in a weight ratio of 1/99 to 99/1 based on the weight of component (A);
(C) an organopolysiloxane having per molecule at least two silicon-bonded hydrogen atoms, where component (C) is used in an amount of 1 to 200 parts by weight for each 100 parts by weight of the total weight of parts (A) and (B); and
(D) a hydrosilylation catalyst in an amount sufficient to promote curing of the composition;
where light permeability at 25° C. for visible light passing through an object obtained by curing the curable organopolysiloxane composition is equal to or exceeds 80%.

15. The curable organopolysiloxane composition of claim 14, where component (A) has a content of silicon-bonded aryl groups not less than 40 mole % of all silicon-bonded organic groups in component (A).

16. The curable organopolysiloxane composition of claim 14, where component (A) is an organopolysiloxane represented by the general formula:

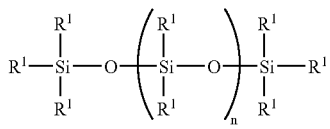

where each $R^1$ comprises the same or different substituted or unsubstituted monovalent hydrocarbon groups, at least two $R^1$'s comprise alkenyl groups, at least one $R^1$ comprises an aryl group, and n is an integer from 5 to 1000.

17. A semiconductor device comprising a light-emitting element, where said semiconductor device is coated with a cured coating made from a curable organopolysiloxane comprising:

(A) a straight-chain organopolysiloxane having per molecule at least two silicon-bonded alkenyl groups and at least one silicon-bonded aryl group;
(B) a branched-chain organopolysiloxane with siloxane units represented by the general formula:

$RSiO_{3/2}$ where R is a substituted or unsubstituted monovalent hydrocarbon group, and where component (B) has per molecule, at least one silicon-bonded alkenyl group and at least one silicon-bonded aryl group, and where component (B) is used in a weight ratio of 1/99 to 99/1 based on the weight of component (A);
(C) an organopolysiloxane having per molecule at least two silicon-bonded hydrogen atoms, where component (C) is used in an amount of 1 to 200 parts by weight for each 100 parts by weight of the total weight of parts (A) and (B); and
(D) a hydrosilylation catalyst in an amount sufficient to promote curing of the composition.

18. The curable organopolysiloxane composition of claim 17, where component (A) has a content of silicon-bonded aryl groups not less than 40 mole % of all silicon-bonded organic groups in component (A).

19. The curable organopolysiloxane composition of claim 17, where component (A) is an organopolysiloxane represented by the general formula:

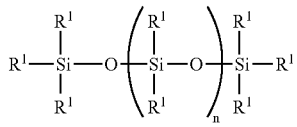

where each $R^1$ comprises the same or different substituted or unsubstituted monovalent hydrocarbon groups, at least two $R^1$'s comprise alkenyl groups, at least one $R^1$ comprises an aryl group, and n is an integer from 5 to 1000.

20. The curable organopolysiloxane composition of claim 17, where component (B) has an average unit formula:

$(R^2SiO_{3/2})_a(R^2{}_2SiO_{2/2})_b(R^2{}_3SiO_{1/2})_c(SiO_{4/2})_d(XO_{1/2})_e$ where each $R^2$ is the same or different substituted or unsubstituted monovalent hydrocarbon group, 0.1 to 40 mole % of all $R^2$'s are alkenyl groups, more than 10 mole % of all $R^2$'s are aryl groups, X is a hydrogen atom or an alkyl group, a is a positive number, b is 0 or a positive number, c is 0 or a positive number, d is 0 or a positive number, e is 0 or a positive number, b/a is 0 to 10, c/a is 0 to 0.5, d/(a+b+c+d) is 0 to 0.3, and e/(a+b+c+d) is 0 to 0.4.

21. The curable organopolysiloxane composition of claim 17, where all or a portion of component (C) has an average unit formula:

$(R^3SiO_{3/2})_f(R^3{}_2SiO_{2/2})_g(R^3{}_3SiO_{1/2})_h(SiO_{4/2})_i(X'O_{1/2})_j$ where each $R^3$ is the same or different substituted or unsubstituted monovalent hydrocarbon groups, or hydrogen atoms; 0.1 to 40 mole % of all $R^3$'s are hydrogen atoms; more than 10 mole % of all $R^3$'s are aryl groups; X' is a hydrogen atom or an alkyl group, f is a positive number, g is 0 or a positive number, h is 0 or a positive number, i is 0 or a positive number, j is 0 or a positive number, g/f is 0 to 10, h/f is 0 to 0.5, i/(f+g+h+i) is 0 to 0.3, and j/(f+g+h+i) is 0 to 0.4.

* * * * *

UNITED STATES PATENT AND TRADEMARK OFFICE
CERTIFICATE OF CORRECTION

PATENT NO. : 7,282,270 B2  Page 1 of 1
APPLICATION NO. : 10/530693
DATED : October 16, 2007
INVENTOR(S) : Yoshitsugu Morita et al.

It is certified that error appears in the above-identified patent and that said Letters Patent is hereby corrected as shown below:

Column 18, line 58, Claim 17 after "hydrocarbon groups" insert therein -- except for alkenyl groups --.

Signed and Sealed this

Sixth Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 7,282,270 B2
APPLICATION NO. : 10/530693
DATED : October 16, 2007
INVENTOR(S) : Yoshitsugu Morita et al.

It is certified that error appears in the above-identified patent and that said Letters Patent is hereby corrected as shown below:

Title page, item (73) Assignee: after Ltd., Delete "Chiyoda" and insert therein -- Tokyo --.

Signed and Sealed this

Twenty-seventh Day of July, 2010

David J. Kappos
*Director of the United States Patent and Trademark Office*